United States Patent
Nozawa et al.

(10) Patent No.: US 7,930,992 B2
(45) Date of Patent: Apr. 26, 2011

(54) PLASMA PROCESSING EQUIPMENT

(75) Inventors: Toshihisa Nozawa, Kobe (JP); Kiyotaka Ishibashi, Miki (JP)

(73) Assignee: Tokyo Electron Limited, Tokyo (JP)

( * ) Notice: Subject to any disclaimer, the term of this patent is extended or adjusted under 35 U.S.C. 154(b) by 841 days.

(21) Appl. No.: 10/570,631

(22) PCT Filed: Sep. 3, 2004

(86) PCT No.: PCT/JP2004/012824
§ 371 (c)(1),
(2), (4) Date: Dec. 19, 2006

(87) PCT Pub. No.: WO2005/031830
PCT Pub. Date: Apr. 7, 2005

(65) Prior Publication Data
US 2007/0113788 A1    May 24, 2007

(30) Foreign Application Priority Data

Sep. 4, 2003  (JP) .................................. 2003-312486
May 28, 2004 (JP) .................................. 2004-159186

(51) Int. Cl.
C23C 16/00   (2006.01)
C23F 1/00    (2006.01)
H01L 21/306  (2006.01)

(52) U.S. Cl. ......................... 118/723 MW; 156/345.41

(58) Field of Classification Search .......... 118/723 MW; 156/345.41
See application file for complete search history.

(56) References Cited

U.S. PATENT DOCUMENTS

| | | | |
|---|---|---|---|
| 5,690,781 A | | 11/1997 | Kazuyoshi et al. |
| 6,091,045 A | * | 7/2000 | Mabuchi et al. ......... 219/121.43 |
| 6,372,084 B2 | * | 4/2002 | Hongo et al. .............. 156/345.1 |
| 7,469,654 B2 | * | 12/2008 | Ishibashi et al. ...... 118/723 MW |
| 2004/0094094 A1 | | 5/2004 | Takahiro et al. |

FOREIGN PATENT DOCUMENTS

| | | | |
|---|---|---|---|
| JP | 8-88190 A | | 4/1996 |
| JP | 9-232099 A | | 9/1997 |
| JP | 2000-294548 A | | 10/2000 |
| JP | 2002-176033 A | | 6/2002 |
| JP | 2002-237462 A | | 8/2002 |
| JP | 2002-299240 A | | 10/2002 |
| JP | 2003-59919 A | | 2/2003 |
| JP | 2003-347282 A | | 12/2003 |
| JP | 2004-186303 | * | 7/2004 |
| WO | WO 03/105544 | * | 12/2003 |

OTHER PUBLICATIONS

JP 2003-059919_Eng dated Feb. 28, 2003.*
JP 09-232099_Eng dated Sep. 5, 1997.*
International Search Report dated Dec. 28, 2004 (one (1) page).
PCT/IB/338, PCT/IB/373 and PCT/IB/237 (Seven (7) pages), dated Dec. 6, 2006.

* cited by examiner

*Primary Examiner* — Parvis Hassanzadeh
*Assistant Examiner* — Rakesh Dhingra
(74) *Attorney, Agent, or Firm* — Crowell & Moring LLP

(57) ABSTRACT

Resonance can be surely provided under any plasma condition in such a manner that an antenna (3) is arranged in an opening of an upper part of a chamber (1) to produce an electromagnetic field generated by a microwave, a top plate (4) for sealing the opening of the chamber (1) is provided under the antenna (3), a ring-shaped ridge (41) is provided on a lower surface of the top plate (4) such that a thickness thereof in a diameter direction is tapered so as to be varied sequentially. Thus, only one kind of top plate has the same effect as a top plate having various thicknesses, so that absorption efficiency to the plasma can be considerably improved and the plasma can be generated stably over a range from a high pressure to a low pressure.

13 Claims, 7 Drawing Sheets

US 7,930,992 B2

PLASMA PROCESSING EQUIPMENT

TECHNICAL FIELD

The present invention relates to a plasma processing equipment and more particularly, to a plasma processing equipment which generates plasma in a chamber by emitting a microwave supplied to an antenna through a top plate formed of a dielectric material to seal an opening of the chamber.

BACKGROUND ART

Recently, as a semiconductor device is highly densified and miniaturized, a plasma processing equipment is used to perform processing such as depositing, etching and ashing in a manufacturing process of the semiconductor device. In particular, according to a microwave plasma processing equipment which can generate plasma with a microwave, plasma can be stably generated even under a (high-vacuum) condition in which a pressure is relatively as low as about 0.1 to 10 Pa. Therefore, a microwave plasma processing equipment using a microwave having a frequency of 2.45 GHz, for example attracts a lot of attention.

FIG. 18 is a sectional view showing an example of such conventional plasma processing equipment. Referring to FIG. 18, a plasma processing equipment comprises a chamber 1 in which a substrate 11 is housed to be processed, a high-frequency power supply 5 for generating a microwave, and an antenna 3 for emitting the microwave into the chamber 1.

The antenna 3 comprises a slot plate 3c, a slow-wave plate 3b, and an antenna cover 3a. A plurality of slots (openings) are formed in the slot plate 3c to emit the microwave into the chamber 1. The microwave generated by the high-frequency power supply 5 is sent to the antenna 3 through a waveguide 6. A top plate 4 which constitutes a part of a wall of the chamber 1 is provided at the top of the chamber, and a sealing member 14 such as an O ring is provided between the top plate 4 and the wall of the chamber 1. The antenna 3 is provided above the top plate 4.

A table 7 is provided to hold the substrate 11. Furthermore, a vacuum pump 9 is connected to the chamber 1 to exhaust the chamber 1. The chamber 1 is exhausted by the vacuum pump 9 and gas to generate plasma such as argon gas is introduced to the chamber 1 under a predetermined range of pressure.

According to the above plasma processing equipment, a microwave generated by the high-frequency power supply 5 reaches the antenna 3 through the waveguide 6. The microwave which reached the antenna 3 is propagated in the slow-wave plate 3b and it is radiated to the top plate 4 through the slot plate 3c. In the top plate 4, the microwave vibrates in the surface direction and is propagated from the center to the periphery to generate an electromagnetic field in the chamber 1. Argon gas is ionized by the electromagnetic field generated in the chamber 1 and a plasma generation region 22 is formed between the substrate 11 and the top plate 4, whereby predetermined plasma processing is performed on the substrate 11.

It is necessary to irradiate the substrate 11 uniformly with the plasma in the plasma processing equipment. However, since plasma intensity in the center differs from that at the periphery, it is described in Japanese Unexamined Patent Publication No. 2002-299240 that lowering in plasma density at the periphery of the substrate 11 is compensated by forming a top plate 4 into a concave configuration and bringing the substrate 11 and the periphery of the top plate 4 closer, to maintain plasma even in a low-pressure processing, so that stable plasma processing can be implemented.

Furthermore, Japanese Unexamined Patent Publication No. 2003-59919 discloses that a ring-shaped sleeve is formed in a dielectric window so that a plasma excitation region may not directly come into contact with a metal surface of a processing container wall, whereby an uniform plasma density can be provided on a substrate surface.

According to a plasma processing equipment, in order to ensure strength of the chamber in which a pressure is reduced to resist force from the atmosphere, the top plate 4 has to have some thickness in the surface direction. The top plate 4 comprises a dielectric body and a resonant region is formed in the dielectric body by a microwave and a strong electric field is generated to form a standing-wave. An electromagnetic field is generated in the chamber 1 by this standing-wave, so that a plasma density becomes high. The dielectric body has to have a thickness suitable for forming the standing-wave.

FIGS. 19A to 19E are views showing electric field intensity distributions depending on thicknesses of top plates. FIG. 19A shows the electric field intensity distribution when a thickness of the top plate 4 is 22.8 mm in the surface direction and a part designated by slanted lines is a part in which the electric field intensity is high. FIG. 19B shows the electric field intensity distribution when a thickness of the top plate 4 is 27.8 mm, in which the electric field intensity distribution is spread from the center to the periphery as compared with FIG. 19A. FIG. 19C shows the electric field intensity distribution when a thickness of the top plate 4 is 31.6 mm, in which the electric field intensity distribution is spread to the periphery except for the center, which is the most suitable thickness. FIG. 19D shows the electric field intensity distribution when a thickness of the top plate 4 is 32.8 mm, in which the electric field intensity is high only in the center. FIG. 19E shows the electric field intensity distribution when a thickness of the top plate 4 is 37.8 mm, in which the electric field intensity is high in the center.

According to the plasma processing equipment shown in FIG. 18, when a pressure in the chamber or a plasma condition such as a power of the microwave is varied, since an electron density in the vicinity of a plasma surface is varied, a penetration depth of the plasma into a material is varied. When a pressure is lowered, since a diffusion coefficient becomes high, the electron density in the vicinity of the plasma surface is lowered and the penetration depth is increased. Thus, when the plasma condition is changed, since an appropriate thickness of the dielectric body is varied, a resonant region for forming the standing-wave is shifted. Therefore, when plasma is to be generated in an optimal state constantly, there is a problem in which it is necessary to prepare a dielectric body having various kinds of thicknesses according to plasma conditions. In addition, since absorption efficiency of the microwave to plasma is low in a low pressure, it is difficult to generate plasma stably in a low pressure (20 mTorr).

DISCLOSURE OF THE INVENTION

It is an object of the present invention to provide a plasma processing equipment which can form an optimal resonant region in a top plate according to a plasma condition, and generate plasma stably in a chamber over a range from a low pressure to high pressure.

A plasma processing equipment according to the present invention is characterized by comprising a plasma generation chamber in which a substrate to be processed is housed and plasma is generated, an antenna arranged in an opening of an upper part of the plasma generation chamber to produce an electromagnetic field generated by a microwave, a top plate mounted under the antenna and having a predetermined uniform thickness in a surface direction to seal the opening of the plasma generation chamber, and a tapered convex portion or concave portion formed on a lower surface of the top plate.

According to the present invention, since a thickness of the top plate in a diameter direction is sequentially varied by the tapered part of the convex portion or concave portion formed in the top plate, an optimal resonant region can be surely formed under any plasma condition. Therefore, only one kind top plate has the same effect as a top plate having various thicknesses, so that absorption efficiency to plasma can be considerably improved and the plasma can be generated stably over a range from a high pressure to a low pressure.

Preferably, the top plate comprises a thin part and a thick part provided by the convex portion or concave portion, and a thickness of the thin part is set to $\lambda/4\pm\lambda/8$.

Since the convex portion or concave portion of the top plate is formed in the following manner, a plasma density can be increased by forming a resonant region in the thick part of the top plate.

In other words, the convex portion or concave portion comprise a ring-shaped ridge formed on the lower surface of the top plate. The plurality of ridges may be formed in a diameter direction concentrically with the center of the top plate, or the ridge is formed such that a part on the side of the top plate is thicker than a part on the side of its end in the diameter direction.

Preferably, the convex portion or concave portion comprises a conical projection formed on the lower surface of the top plate, and the conical projection is formed in the center of the lower surface of the top plate. The plurality of conical projections may be provided so as to be arranged in the form of ring.

Preferably, the convex portion or concave portion comprises the plurality of ring-shaped concave portions, a first downward ridge formed between the ring-shaped concave portions, and a second downward ridge formed outside the ring-shaped concave portion at the most outer periphery.

Preferably, the second convex portion is thicker than the first convex portion.

Preferably, a concave portion is formed in the center of the top plate on the side of the antenna, and a material having a dielectric constant different from that of the top plate is disposed in the concave portion.

Preferably, a depth of the concave portion of the top plate is not less than $\lambda/8$ or not less than $\lambda/4$.

Preferably, the convex portion is formed in the center of the top plate on the side of the substrate to be processed, and a thickness of the top plate at the periphery of the convex portion is $\lambda/4\pm\lambda/8$.

Preferably, the substrate to be processed is in the form of a disk, and when it is assumed that a radius of the substrate to be processed is R, at least one of the convex portions or concave portions is formed beyond the radius R from the center of the top plate.

Preferably, when it is assumed that a distance between the top plate and the substrate to be processed is D, at least one of the convex portions or concave portions is formed within the radius D from the center of the top plate.

Preferably, the antenna comprises a slot plate in which slots are distributed in its surface, and the convex portion or concave portion is formed in the top plate so as to correspond to the slots in the slot plate.

BEST MODE FOR CARRYING OUT THE INVENTION

Figure 1:
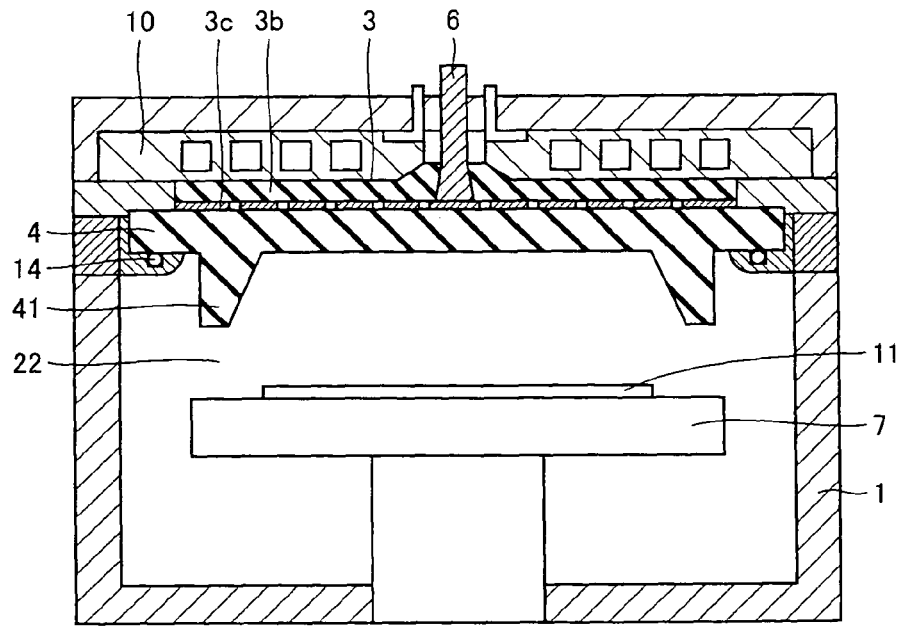
FIG. 1 is a sectional view showing a plasma processing equipment according to one embodiment of the present invention.
Figure 2:
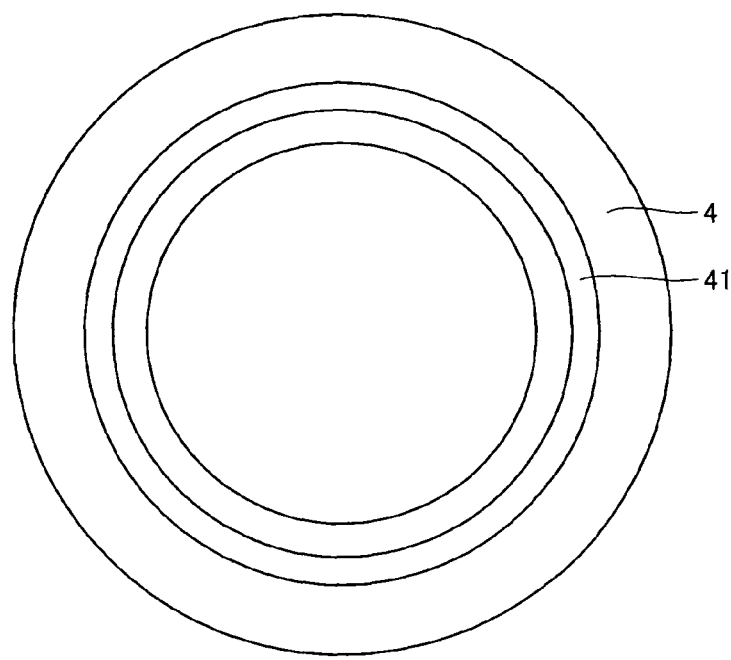
FIG. 2 is a view showing a top plate in FIG. 1 viewed from beneath.

FIG. 1 is a sectional view showing a plasma processing equipment according to one embodiment of the present invention, and FIG. 2 is a view showing a dielectric plate as viewed from beneath in FIG. 1.

Figure 18:
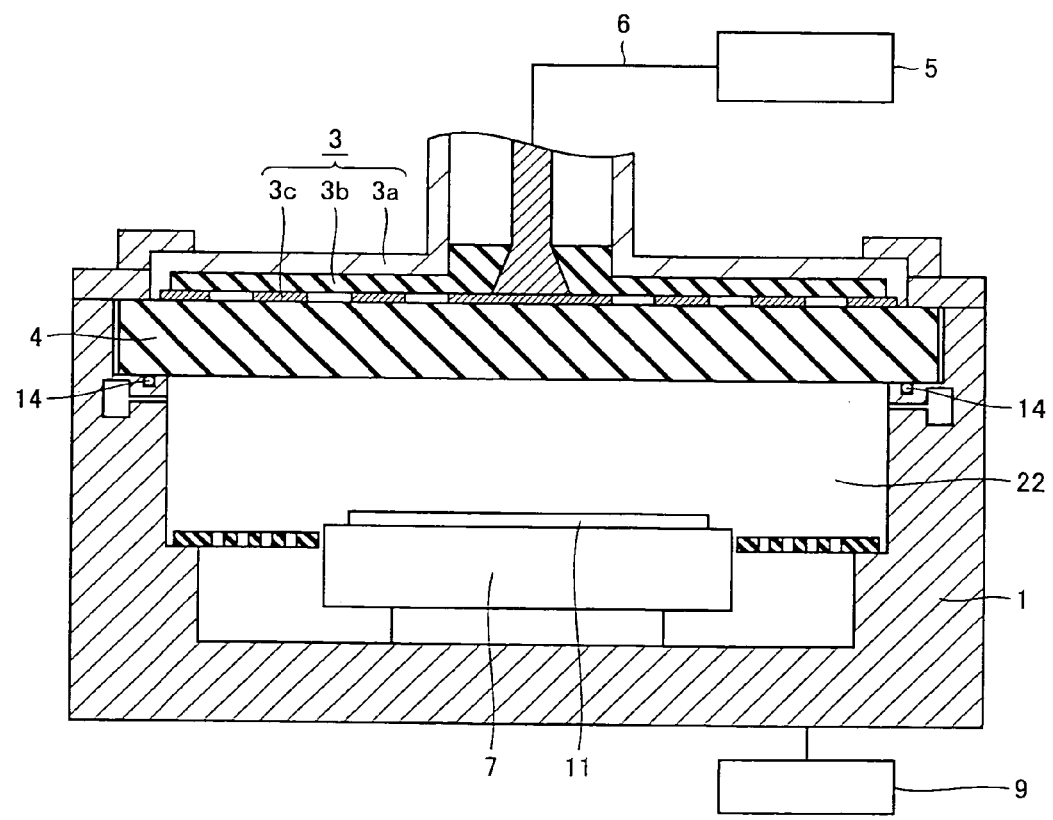
FIG. 18 is a sectional view showing an example of a conventional plasma processing equipment.
Figure 19A:
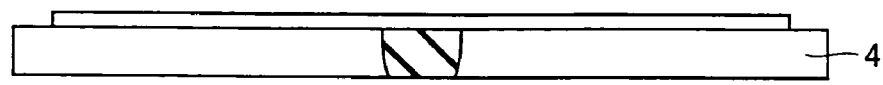
FIG. 19A is a view showing an electric field intensity distribution depending on a thickness of a top plate.
Figure 19B:
FIG. 19B is a view showing an electric field intensity distribution depending on a thickness of a top plate.
Figure 19C:
FIG. 19C is a view showing an electric field intensity distribution depending on a thickness of a top plate.
Figure 19D:
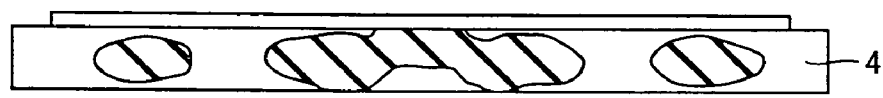
FIG. 19D is a view showing an electric field intensity distribution depending on a thickness of a top plate.
Figure 19E:
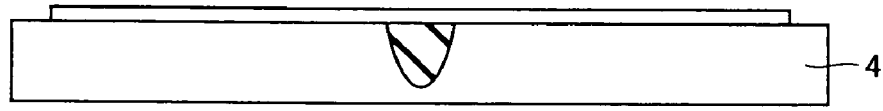
FIG. 19E is a view showing an electric field intensity distribution depending on a thickness of a top plate.

Similar to FIG. 18, the plasma processing equipment comprises a chamber 1 in which a substrate 11 is housed and processed, and an antenna 3 for emitting a microwave into the chamber 1.

The microwave generated by a high-frequency power supply (not shown) is transmitted to the antenna 3 through a waveguide 6. A top plate 4 which seals an opening of the chamber 1 and constitutes a part of a wall of the chamber 1 is provided at an upper part of the chamber 1, and a sealing member 14 such as an O ring is provided between the top plate 4 and the wall of the chamber 1. The antenna 3 is provided on the top plate 4. A cooling plate 10 in which a cooling medium flows is provided on the antenna 3.

A table 7 on which the housed substrate 11 is held is provided in the chamber 1. The table 7 has a heating function for heating the substrate 11. Furthermore, the vacuum pump shown in FIG. 18 is connected to the chamber 1 to exhaust the chamber 1. The vacuum pump exhausts the chamber 1 and then argon gas, for example as gas for generating plasma under a predetermined pressure range is introduced into the chamber 1.

According to the above plasma equipment, the microwave generated by the high-frequency power supply reaches the antenna through the waveguide 6. The microwave which reached the antenna 3 is propagated through a slow-wave plate 3b and a slot plate 3c and a resonant region is formed in the top plate 4 and a standing wave is generated to form an electromagnetic field in the chamber 1. The argon gas is dissociated by the electromagnetic field generated in the chamber 1 and a plasma generation region 22 is formed between the substrate 11 and the top plate 4, whereby predetermined plasma processing is performed for the substrate 11.

The top plate 4 is in the form of circular plate having a predetermined uniform thickness in a surface direction to ensure strength and resist force from the atmosphere, and a convex portion or concave portion is formed on its lower surface. More specifically, as the convex portion or concave portion, a ring-shaped ridge 41 is formed concentrically with the center of the top plate 4 at the periphery of the top plate 4 spaced from an edge of thereof in a diameter direction. An outer peripheral surface of the ridge 41 is perpendicular to the lower surface of the top plate 4 and an inner peripheral surface is tapered so as to form a predetermined angle with respect to the top plate 4, so that a cross section of the convex portion or concave portion is rectangular. The reason why the ridge 41 is formed at the periphery of the top plate 4 is to enhance a plasma density at the periphery thereof because a plasma density at its periphery is low while it is high in the center thereof when the microwave is supplied from the antenna 3 to the top plate 4.

Figure 3:
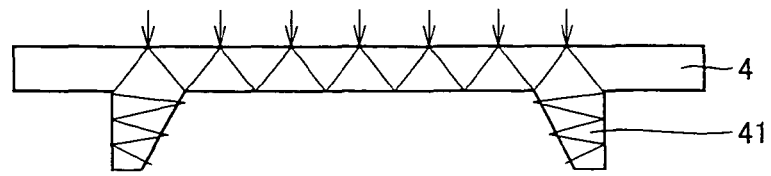
FIG. 3 is a view for explaining a state in which a microwave is propagated in the top plate.

FIG. 3 is a view for explaining a state in which the microwave is propagated in the top plate. Although the top plate 4 comprises a thick part because of the ridge 41 and a thin part except for the ridge 41, when a thickness of the thin part is set to $\lambda/4 \pm \lambda/8$, the microwave is not likely to be propagated in the thin part of the top plate 4.

The reason for the above will be described. An electromagnetic wave is propagated in the top plate in a mode A and a mode B. The mode A exists when an electron density becomes a predetermined value or more and the mode B exists only when the electron density is relatively low, so that when the electron density is high to some degree, the microwave propagation in the mode B is prevented.

However, this largely depends on the thickness of the top plate. That is, in case that the thickness is not less than $\lambda/4$, as the thickness is increased, a lower limit of the electron density which can prevent the propagation in the mode B is raised. In case that the thickness is not less than $\lambda/2$, since the mode B can exist without depending on the electron density, the propagation in the mode B cannot be prevented. Meanwhile, when the thickness is not more than $\lambda/4$, the lower limit of the electron density which can prevent the propagation in the mode B is not changed. Therefore, the thickness $\lambda/4$ is an optimal thickness in view of strength of the top plate. However, within a range of $\pm\lambda/8$, the propagation in the mode B can be prevented to a large extent.

When the microwave supplied to the antenna is emitted from the slots of the antenna 3 downward, it is reflected in the top plate 4 as shown in FIG. 3 and vibrates in the surface direction through repetition of the reflection in the top plate 4 to form a resonant region to form a standing wave. Since the microwave in the ridge 41 is multiply-reflected by side walls of the ridge 41 and accumulated in the top plate 4 and not likely to enter the plasma generation region 22, the microwave is likely to be accumulated in the ridge 41. Thus, the plasma density at the periphery of the top plate 4 can becomes high because of the ridge 41. The ridge 41 forms a resonant region at the periphery of the top plate 4, in which the microwave vibrates in the diameter direction which is perpendicular to the surface direction of the top plate 4.

Since the ridge 41 is tapered so that it is thick on the side of the top plate 4 in the diameter direction and it becomes thin toward its end in the diameter direction, a part in which an amplitude of the microwave vibrating in the diameter direction coincides with the thickness of the ridge 41 surely exists. In other words, since the ridge 41 forms the resonant region at the periphery of the top plate 4 and the resonant region automatically rises or falls depending on the plasma density, the resonance surely exists under any plasma condition.

Thus, since an optimal resonant region can be formed in the top plate 4, a strong electric field can be generated to generate the standing wave and the plasma density can be increased, so that plasma can be stably generated over a range from a high pressure to a low pressure.

In addition, the ridge 41 may be tapered on both outer and inner peripheral surfaces. Furthermore, the position or the configuration of the ridge 41 may be arbitrarily selected depending on the thickness of the top plate 4.

Although the dorm-shaped top plate is described in the above Japanese Unexamined Patent Publication No. 2002-299240, in the case of dorm configuration, a resonance position is largely moved in a radius direction, so that a part in which plasma is strong is moved and its uniformity is varied. Meanwhile, the present invention is characterized in that uniformity can be adjusted by collecting the plasma in the vicinity of the outer periphery or the center of the top plate 4 with the ridge 41.

Figure 4:
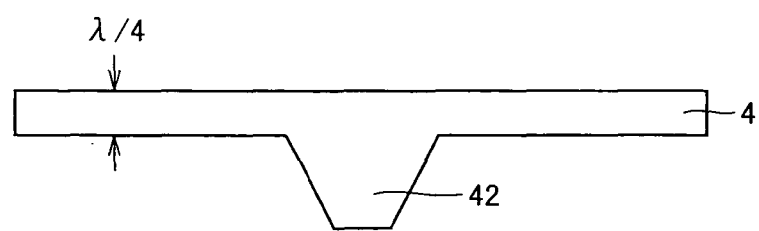
FIG. 4 is a sectional view showing an example in which a convex portion is formed in the center of a top plate according to another embodiment of the present invention.

FIG. 4 is a sectional view showing a variation of the convex portion formed in a top plate according to another embodiment of the present invention, in which a conical projection 42 is formed downward in almost the center of a lower part of a top plate 4 as a convex portion. According to this example, since a resonant region can be formed at the periphery of the center in which the projection 42 is formed, a plasma density can be high at the periphery of the center, so that this example is effective when electric field intensity is low at the periphery of the center of the top plate 4.

Figure 5:
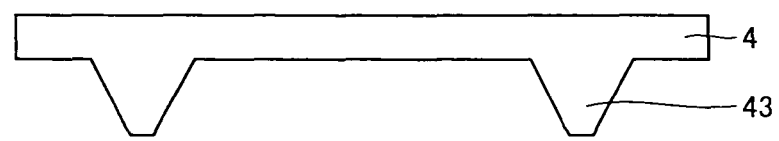
FIG. 5 is a sectional view showing an example in which a convex portion is formed at a periphery of a top plate according to another embodiment of the present invention.

FIG. 5 shows an example in which a ring-shaped ridge 43 is formed at the periphery of a top plate 4 and its outer and inner peripheral surfaces are tapered. When both outer and inner peripheral surfaces are tapered, since a difference between a thickness on the side of the top plate in the diameter direction and a thickness on the end in the diameter direction can be large, a resonant region formed at the periphery of the ridge 43 can be enlarged, so that a plasma density at its periphery can be high.

Figure 6:
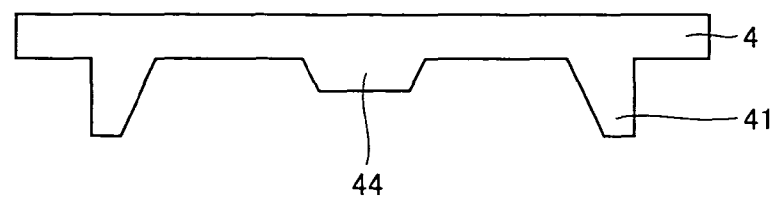
FIG. 6 is a sectional view showing an example in which a convex portion is formed in the center and the periphery of a top plate according to another embodiment of the present invention.

FIG. 6 shows an example in which in addition to the ridge 41 shown in FIG. 2, a conical projection 44 having a thickness larger than that of the ridge 41 is provided in the center of a top plate 4. According to this example, since a resonant region is formed at the periphery due to the ridge 41 and a resonant region is formed in the center due to the projection 44, even when a microwave having an amplitude larger than the thickness of the ridge 41 in the diameter direction is inputted, the resonant region can be formed by the projection 44 in the center, so that a plasma density can be high in the center.

Figure 7:
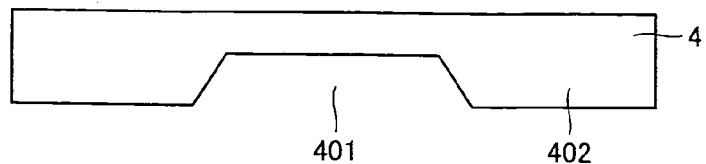
FIG. 7 is a sectional view showing an example in which a concave portion is formed in the center of a top plate according to another embodiment of the present invention.

FIG. 7 is a sectional view showing a top plate in which a concave portion is formed according to still another embodiment of the present invention, in which a circular concave portion 401 with a downward opening is formed in almost the center of a top plate 4. An inner peripheral surface of the concave portion 401 is tapered such that its opening diameter is increased downward. Thus, a convex portion 402 is formed outside the concave portion 401. According to this example, since a resonant region is formed in a thick part of the concave portion 402, a plasma density in this part can become high, so that this example is effective when an electric field density is low at the peripheral part of the top plate 4.

Figure 8:
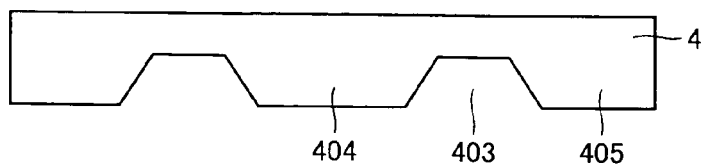
FIG. 8 is a sectional view showing an example in which a concave portion is formed in the periphery of a top plate according to another embodiment of the present invention.

FIG. 8 shows an example in which a ring-shaped concave portion 403 is formed concentrically with a top plate 4. Outer and inner peripheral surfaces of the concave portion 403 are tapered such that an opening diameter is increased downward. Thus a downward convex portion 404 is formed inside the concave portion 403 and a ridge 405 is formed outside the concave portion 403. In this example, since resonant regions are formed in thick parts of the convex portion 404 and the ridge 405, a plasma density in these parts can become high.

Figure 9:
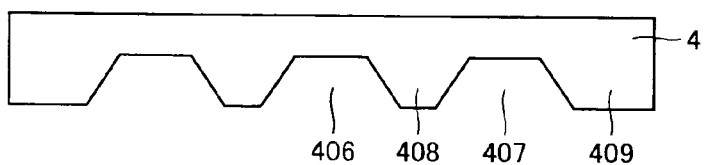
FIG. 9 is a sectional view showing an example in which a concave portion is formed in the center and the periphery of a top plate according to another embodiment of the present invention.

FIG. 9 shows an example in which a circular concave portion 406 with a downward opening is formed in almost the center of a top plate 4, and a ring-shaped concave portion 407 is formed outside the concave portion 406. An outer peripheral surface of the concave portion 406 is tapered such that an opening diameter is increased downward and outer and inner peripheral surfaces of the concave portion 407 are tapered such that an opening diameter is increased downward like the concave portion 403 shown in FIG. 8. In this example, since a ridge 408 is formed outside the concave portion 406 and a ridge 409 is formed outside the concave portion 407, resonant regions are formed in thick parts of the ridges 408 and 409, so that a plasma density in these parts can become high.

Figure 10:
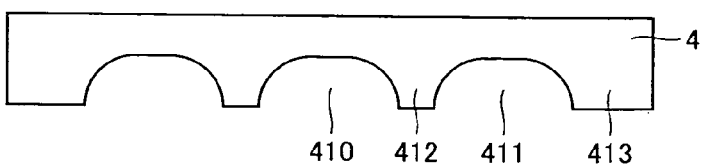
FIG. 10 is a sectional view showing an example in which a concave portion is formed in the center and the periphery of a top plate according to another embodiment of the present invention.

FIG. 10 is a sectional view showing a variation of the concave portion formed in a top plate according still another embodiment of the present invention. According to this embodiment, instead of the concave portion 406 and the ring-shaped concave portion 407 shown in FIG. 9, a concave portion 410 and a ring-shaped concave portion 411 are formed. Although the concave portions 410 and 411 have downward openings, an outer peripheral surface of the concave portion 410 is not tapered but formed into an arc configuration and outer and inner peripheral surfaces of the concave portion 411 are also formed into arc configurations. Thus, the tapered configuration in the present invention includes the arc configuration.

Thus, as the top plate 4 is formed such that its thickness is changed according to the arc configuration similar to FIG. 9, a ridge 412 is formed between the concave portion 410 and the ring-shaped concave portion 411 and a ridge 413 is formed outside the concave portion 411, so that resonant regions are formed in these thick parts. As a result, a plasma density can become high in these parts.

Figure 11:
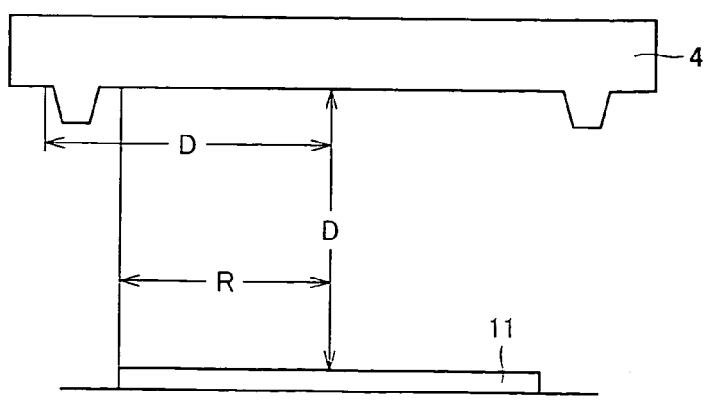
FIG. 11 is a view for explaining a position of the top plate in which the convex portion or the concave portion is formed.

In addition, it is desirable that at least one tapered part is formed in the top plate 4 beyond a radius R of the substrate 11 as shown in FIG. 11 in the above embodiments shown in FIGS. 1 to 10. Thus, the plasma density is prevented from being lowered excessively at the periphery of an edge of the substrate 11.

Further preferably, when it is assumed that a distance between the top plate 4 and the substrate 11 shown in FIG. 11 is D, at least one tapered part is formed within the radius D from the center of the top plate 4. Thus, the plasma at the periphery of the center of the top plate 4 can be prevented from being lowered excessively.

Figure 12:
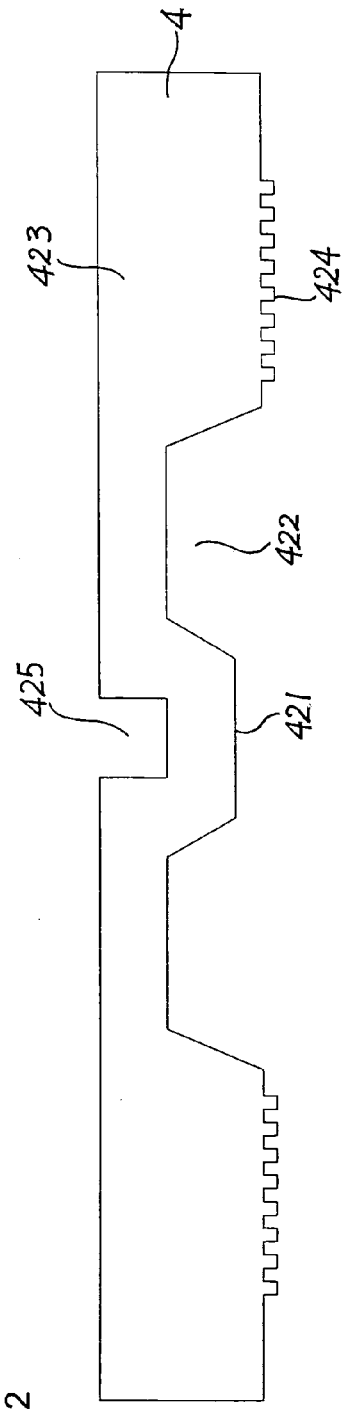
FIG. 12 is a sectional view showing a variation of the concave portion formed in a top plate according to still another embodiment of the present invention.

FIG. 12 is a sectional view showing a variation of the concave portion formed in a top plate according to still another embodiment of the present invention. According to an example shown in FIG. 12, a downward convex portion 421 is formed in the center of a top plate 4 and a thickness of the top plate 4 in the vicinity of the outside of the convex portion 421 is set to $\lambda/4 \pm \lambda/8$. Furthermore, a ring-shaped concave portion 422 with a downward opening is formed outside the convex portion 421, and a downward thick convex portion 423 is formed outside the concave portion 422, and a plurality of ring-shaped grooves 424 are concentrically formed in the lower surface except for an edge of the convex portion 423. An outer peripheral surface of the convex portion 421 and an inner peripheral surface of the convex portion 423 are tapered.

In this example, since the thick convex portion 423 is formed outside the concave portion 422, strength is enhanced. In addition, as a plasma density becomes high and an electric field density also becomes high in the convex portion 423, the plasma is likely to be emitted. However, since the plurality of ring-shaped grooves 424 prevent the plasma from being emitted from the surface, the plasma is likely to be emitted from the periphery in which the grooves are not formed.

Furthermore, a concave portion 425 is formed in an upper part of the top plate 4 on the side of an antenna 3, that is, on the side of the atmosphere. It is preferable that the concave portion 425 has a deepness of $\lambda/8$ or more and more preferably it has a deepness of $\lambda/4$ or more. The atmosphere, a conductor or a material (not shown) having a dielectric constant different from that of the top plate 4 is arranged in the concave portion 425 to improve a problem such that the microwave is strongly reflected in the vicinity of the concave portion 425 in the center of the top plate 4, so that plasma is likely to become strong in this part. When the thickness at the periphery of the concave portion 425 is around $\lambda/4$, its effect is further enhanced.

In addition, the concave portion 425 may be provided at the periphery of the top plate 4 on the side of the antenna 3 instead of its center.

Figure 13:
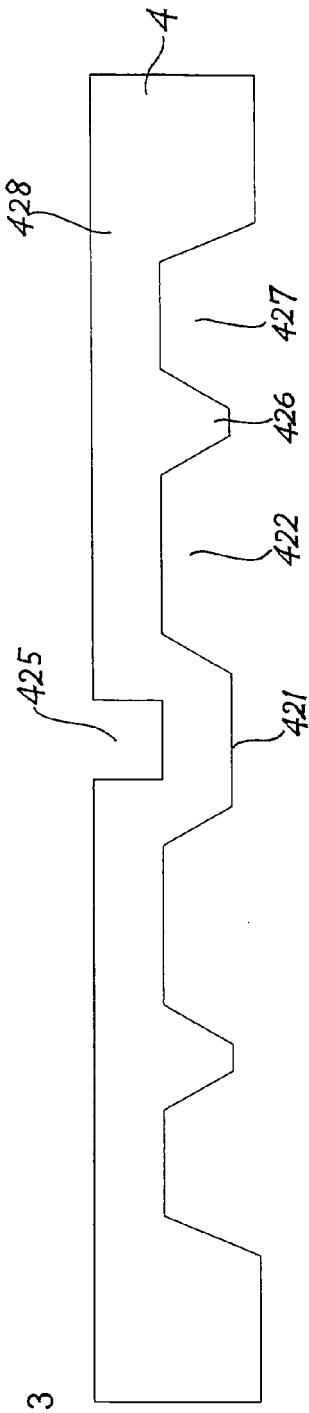
FIG. 13 is a sectional view showing a variation of the concave portion formed in a top plate according to still another embodiment of the present invention.

According to an example shown in FIG. 13, a downward convex portion 421 is formed in the center of a lower part of a top plate 4, a ring-shaped concave portion 422 with a downward opening is formed outside the convex portion 421, a downward ridge 426 is formed outside the concave portion 422, a ring-shaped concave portion 427 with a downward opening is formed outside the ridge 426, and a downward ring-shaped ridge 428 is formed outside the concave portion 427. The ridge 428 formed at the most outer periphery is thicker than the convex portion 421 and the ridge 426. Furthermore, outer and inner peripheral surfaces of the concave portions 422 and 427 are tapered.

In this example, mechanical strength of the top plate 4 can be maintained because the ridge 426 is formed. In addition, although resonant regions are formed due to the ridges 426 and 428, since the ridge 428 at the most outer periphery is thicker than that of the ridge 426, a plasma density in this part can be higher than that in the ridge 426.

Figure 14:
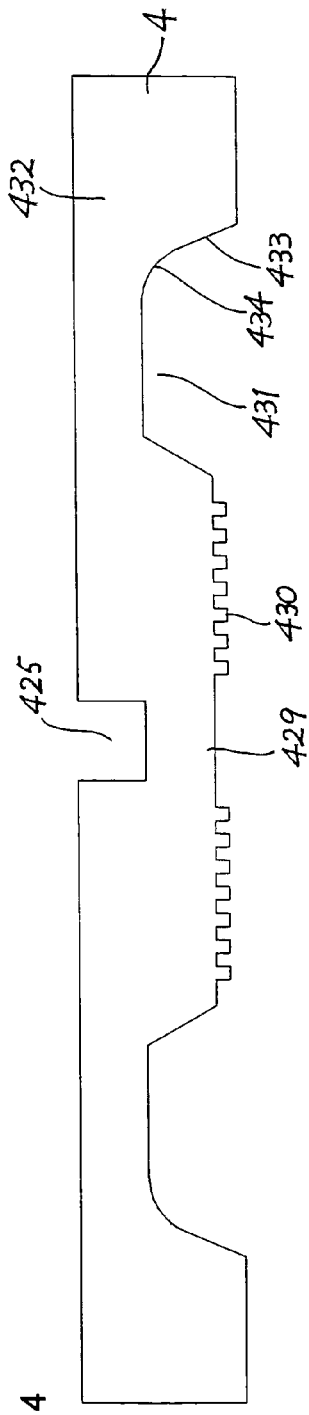
FIG. 14 is a sectional view showing a variation of the concave portion formed in a top plate according to still another embodiment of the present invention.

According to an example shown in FIG. 14, a downward disc-shaped convex portion 429 is formed in the center of a top plate 4, a plurality of grooves 430 are concentrically formed in a lower surface of the top plate 4, a ring-shaped concave portion 431 with a downward opening is formed outside the convex portion 429, and a downward ridge 432 is formed outside the concave portion 431. The ridge 432 is thicker than the convex portion 429. In this example, mechanical strength of the top plate 4 can be enhanced by thickening the center of the top plate 4 with the convex portion 429. Since the convex portion 429 is thick, although plasma is likely to be propagated and its density becomes high, the plasma is prevented from being emitted due to the grooves 430. Thus, the plasma is not likely to be propagated in the thin concave portion 431, so that a plasma density can becomes high in the ridge 432 at the most outer periphery. In addition, in this example also like FIG. 12, a concave portion 425 is formed in the top plate 4 on the side of the antenna 3, that is, on the side of the atmosphere. In addition, as shown in FIG. 14, the concave portion 431 has a configuration in which a tapered part 433 and an arc-shaped part 434 are combined, so that the same plasma control effect can be provided while a structure considering workability is provided.

Figure 15:
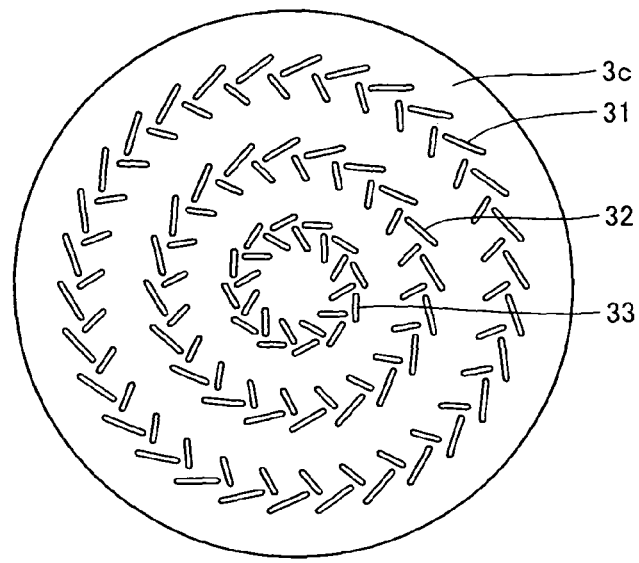
FIG. 15 is a view showing slots in a slot plate.
Figure 16:
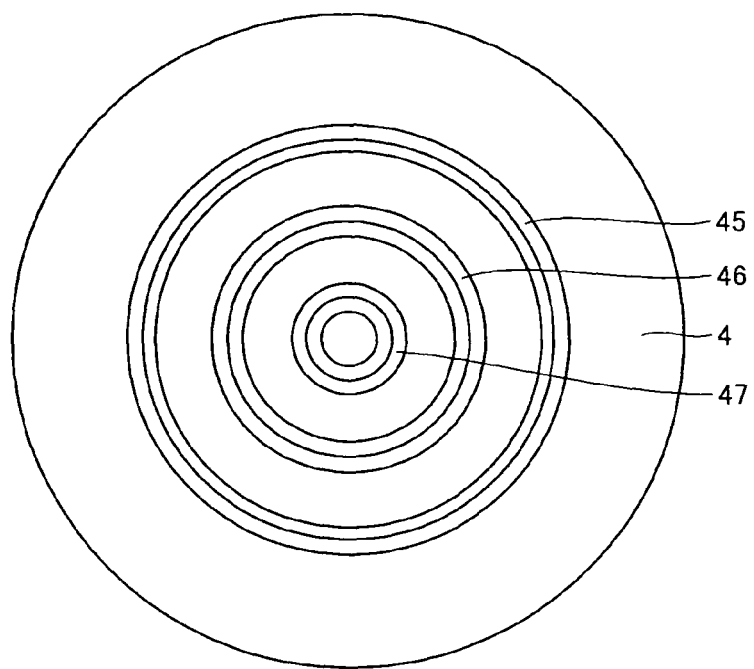
FIG. 16 is a view showing an example in which ridges are formed in a top plate corresponding to the slots in the slot plate shown in FIG. 15.

FIG. 15 is a view showing slots in a slot plate, and FIG. 16 is a view showing ridges corresponding to the slots shown in FIG. 15. Namely, slots 31, 32 and 33 concentrically arranged in three rings are formed in the disk-shaped slot plate 3c as shown in FIG. 15. A microwave inputted into the waveguide 6 is emitted into a chamber 1 through the slots 31, 32 and 33 in the slot plate 3c to generate an electromagnetic field. Therefore, electric field intensity at parts corresponding to the slots 31, 32 and 33 is the highest in a top plate 4.

Thus, as shown in FIG. 16, the plurality of ring-shaped ridges 45, 46 and 47 are formed so as to correspond to the slots 31, 32 and 33, respectively. Although outer peripheral surfaces of these ridges 45, 46 and 47 are perpendicular to a lower surface of the top plate 4 and inner peripheral surfaces thereof are tapered so as to have predetermined angles with respect to the top plate 4 like the ridge 41 shown in FIG. 1, the outer peripheral surfaces thereof may be tapered. In the top plate 4, since the electric field intensity is high at parts corresponding to the slots 31, 32 and 33, when resonant regions are formed at these parts, plasma can be uniformly provided.

Figure 17:
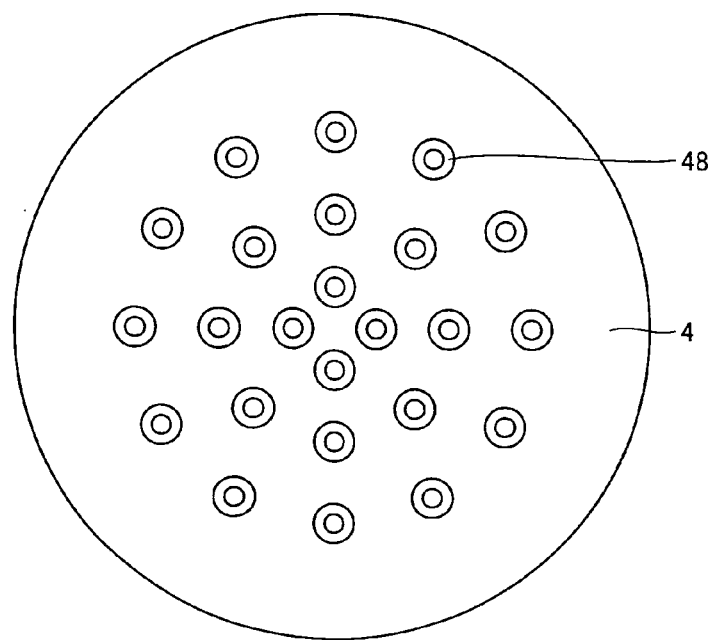
FIG. 17 is a view showing a top plate viewed from beneath according to still another embodiment of the present invention.

FIG. 17 is a view showing a top plate viewed from beneath according to still another embodiment of the present invention. While the ring-shaped ridges 45, 46 and 47 are provided so as to correspond to the slots 31, 32 and 33 of the slot plate 3c, respectively in the embodiment shown in FIG. 16, a plurality of conical projections 48 each having a small diameter are formed so as to correspond to slots 31, 32 and 33 in this embodiment. According to this embodiment also, resonance can be dispersed by many projections 48 in the strong electric field intensity generated in the slots 31, 32 and 33.

According to the present invention, in case that a thickness of the top plate 4 is 21 mm, a diameter of the top plate 4 is 280 mm, a diameter of the ridge 41 is 220 mm, and a height of the ridge 41 is 22 mm, even when a plasma pressure is varied from 1 to 100 Torr, and an output of the microwave is varied from 100 to 3000 W as plasma conditions, for example, plasma can be stably generated.

Although the embodiments of the present invention have been described with reference to the drawings in the above, the present invention is not limited to the above-illustrated embodiments. Various kinds of modifications and variations may be added to the illustrated embodiments within the same or equal scope of the present invention.

INDUSTRIAL APPLICABILITY

The present invention can be applied to a plasma processing equipment which can generate plasma stably over a range from a high pressure to a low pressure, in which a top plate 4 for sealing an opening of a chamber is provided under an antenna to generate an electromagnetic field by a microwave, and a ring-shaped ridge 41 is provided on a lower surface of the top plate 4 such that a thickness thereof in a diameter direction is tapered so as to be varied sequentially, so that resonance is surely provided under any plasma condition.

The invention claimed is:

1. A plasma processing equipment comprising:
   a plasma generation chamber in which a substrate to be processed is housed and plasma is generated;
   an antenna arranged in an opening of an upper part of said plasma generation chamber to produce an electromagnetic field generated by a microwave; and
   a top plate mounted under said antenna to seal the opening of said plasma generation chamber, wherein
   said top plate comprises a concave and convex configuration having at least one tapered ring-shaped concave portion formed around the center on its lower surface,
   a top of said tapered ring-shaped concave portion includes a flat portion,
   said antenna comprises a slot plate in which slots are formed so as to be distributed in a predetermined pattern, and
   at least one ring-shaped convex portion is formed on the lower surface of the top plate so as to extend in a position corresponding to the predetermined pattern of slots in the slot antenna.

2. The plasma processing equipment according to claim 1, wherein said top plate comprises a thin part and a thick part provided by said concave and convex configuration, and a thickness of said thin part is set to $\lambda/4\pm\lambda/8$.

3. The plasma processing equipment according to claim 1, wherein said concave and convex configuration comprises a plurality of tapered ring-shaped concave portions, a first convex portion formed between said tapered ring-shaped concave portions, and a second convex portion formed outside a tapered ring-shaped concave portion at the most outer periphery.

4. The plasma processing equipment according to claim 3, wherein said second ridge is thicker than said first ridge.

5. The plasma processing equipment according to claim 1, wherein a concave portion is formed in the center of said top plate on the side of the antenna, and a material having a dielectric constant different from that of said top plate is arranged in said concave portion.

6. The plasma processing equipment according to claim 5, wherein a depth of the concave portion of said top plate on the side of the antenna is not less than $\lambda/8$.

7. The plasma processing equipment according to claim 5, wherein a depth of the concave portion of said top plate on the side of the antenna is not less than $\lambda/4$.

8. The plasma processing equipment according to claim 1, wherein a convex portion of said concave and convex configuration is formed in the center of said top plate on the side of said substrate to be processed, and a thickness of the top plate at the periphery of said convex portion is $\lambda/4\pm\lambda/8$.

9. The plasma processing equipment according to claim 1, wherein said substrate to be processed is in the form of a disk, and when it is assumed that a radius of said substrate to be processed is R, at least one of the convex portions or concave portions of the concave and convex configuration is formed beyond the radius R from the center of said top plate.

10. The plasma processing equipment according to claim 1, wherein when it is assumed that a distance between said top plate and said substrate to be processed is D, the at least one convex portion or the at least one concave portion of said concave and convex configuration is formed within the radius D from the center of said top plate.

11. The plasma processing equipment according to claim 1, wherein the at least one ring-shaped convex portion comprises a plurality of ring-shaped convex portions formed concentrically on the lower surface of said top plate.

12. A plasma processing equipment comprising:
a plasma generation chamber in which a substrate to be processed is housed and plasma is generated;
an antenna arranged in an opening of an upper part of said plasma generation chamber to produce an electromagnetic field generated by a microwave; and
a top plate mounted under said antenna to seal the opening of said plasma generation chamber, wherein
said top plate comprises a plurality of conical projections formed on a lower surface of said top plate and arranged in the form of a ring,
said antenna comprises a slot plate in which slots are formed so as to be distributed in a predetermined pattern, and
the conical projections are formed so as to correspond to the slots in the slot antenna.

13. The plasma processing equipment according to claim 12, wherein the conical projections are formed about a center of the lower surface of said top plate and arranged in the form of concentric rings.

* * * * *